(12) United States Patent
Ottlinger et al.

(10) Patent No.: US 10,686,120 B2
(45) Date of Patent: Jun. 16, 2020

(54) METHOD FOR PRODUCING CERAMIC MULTI-LAYER COMPONENTS

(71) Applicant: EPCOS AG, Munich (DE)

(72) Inventors: Marion Ottlinger, Deutschlandsberg (AT); Robert Krumphals, Deutschlandsberg (AT); Alexander Glazunov, Deutschlandsberg (AT)

(73) Assignee: EPCOS AG, Munich (DE)

( * ) Notice: Subject to any disclaimer, the term of this patent is extended or adjusted under 35 U.S.C. 154(b) by 188 days.

(21) Appl. No.: 14/913,367

(22) PCT Filed: Jul. 14, 2014

(86) PCT No.: PCT/EP2014/065038
§ 371 (c)(1),
(2) Date: Feb. 21, 2016

(87) PCT Pub. No.: WO2015/028192
PCT Pub. Date: Mar. 5, 2015

(65) Prior Publication Data
US 2016/0204339 A1      Jul. 14, 2016

(30) Foreign Application Priority Data

Aug. 27, 2013 (DE) .......... 10 2013 109 267
Oct. 8, 2013 (DE) .......... 10 2013 111 121

(51) Int. Cl.
*H01L 41/273* (2013.01)
*H01G 4/30* (2006.01)
(Continued)

(52) U.S. Cl.
CPC .......... *H01L 41/273* (2013.01); *H01G 4/012* (2013.01); *H01G 4/12* (2013.01); *H01G 4/30* (2013.01);
(Continued)

(58) Field of Classification Search
CPC ... H01L 41/047; H01L 41/083; H01L 41/273; H01L 41/335; H01L 41/0838;
(Continued)

(56) References Cited

U.S. PATENT DOCUMENTS 5,237,239 A * 8/1993 Inoue .................. H01L 41/0838
                                                              310/328
7,087,970 B2     8/2006 Nakamura
(Continued)

FOREIGN PATENT DOCUMENTS

DE    602004004841 T2    11/2007
DE    102007004813 A1    8/2008
(Continued)

OTHER PUBLICATIONS

Machine Translation (English) of Japanese Patent Publication, JP 61-208880, dated Jan. 2018.*

*Primary Examiner* — A. Dexter Tugbang
(74) *Attorney, Agent, or Firm* — Slater Matsil, LLP

(57) ABSTRACT

A method can be used for producing ceramic multilayer components. The method includes providing green layers for the ceramic multilayer components, stacking the green layers into a stack, and subsequently compressing the stack to form a block. Furthermore, the method includes isolating the block into partial blocks that each have a longitudinal direction, thermally treating the partial blocks, subsequently mechanically machining surfaces of the partial blocks, and providing the partial blocks with outer electrodes and isolating the partial blocks in each case transversely to the longitudinal direction into individual ceramic multilayer components.

18 Claims, 2 Drawing Sheets

(51) Int. Cl.
  *H01L 41/335* (2013.01)
  *H01L 41/047* (2006.01)
  *H01L 41/083* (2006.01)
  *H01G 4/012* (2006.01)
  *H01G 4/12* (2006.01)

(52) U.S. Cl.
  CPC .......... *H01L 41/047* (2013.01); *H01L 41/083* (2013.01); *H01L 41/0838* (2013.01); *H01L 41/335* (2013.01); *Y10T 29/42* (2015.01); *Y10T 29/43* (2015.01); *Y10T 29/49126* (2015.01); *Y10T 29/49163* (2015.01)

(58) Field of Classification Search
  CPC .......... H01G 4/012; H01G 4/083; H01G 4/12; H01G 4/30; H01G 4/232; Y10T 29/42; Y10T 29/43; Y10T 29/49126; Y10T 29/49163
  See application file for complete search history.

(56) References Cited

U.S. PATENT DOCUMENTS

| | | | |
|---|---|---|---|
| 7,905,000 B2 | 3/2011 | Ganster et al. | |
| 2002/0149297 A1* | 10/2002 | Yamamoto | H01L 41/083 310/328 |
| 2003/0070271 A1 | 4/2003 | Yasugi et al. | |
| 2003/0107867 A1* | 6/2003 | Iwase | H01G 4/30 361/301.4 |
| 2007/0200109 A1* | 8/2007 | Sciortino | H01L 41/273 257/17 |
| 2009/0033179 A1* | 2/2009 | Ito | H01L 41/083 310/358 |
| 2012/0019978 A1 | 1/2012 | Yoshida | |
| 2012/0228997 A1* | 9/2012 | Nishikawa | H01L 41/083 310/323.02 |
| 2012/0229952 A1 | 9/2012 | Kim | |
| 2015/0042212 A1 | 2/2015 | Somitsch et al. | |
| 2015/0123516 A1 | 5/2015 | Rinner et al. | |

FOREIGN PATENT DOCUMENTS

| | | |
|---|---|---|
| DE | 102007040249 A1 | 3/2009 |
| DE | 102009028259 A1 | 2/2011 |
| DE | 102012101351 A1 | 8/2013 |
| DE | 102012105059 A1 | 12/2013 |
| JP | 61208880 A | 9/1986 |
| JP | 2007134561 A * | 5/2007 |
| JP | 2009065014 A | 3/2009 |
| JP | 2012044148 A | 3/2012 |
| JP | 2012191165 A | 10/2012 |
| WO | 2008092740 A2 | 8/2008 |

* cited by examiner

METHOD FOR PRODUCING CERAMIC MULTI-LAYER COMPONENTS

This patent application is a national phase filing under section 371 of PCT/EP2014/065038, filed Jul. 14, 2014, which claims the priority of German patent application 10 2013 109 267.5, filed Aug. 27, 2013 and German patent application 10 2013 111 121.1, filed Oct. 8, 2013, each of which is incorporated herein by reference in its entirety.

TECHNICAL FIELD

The present invention relates to a method for producing ceramic multilayer components and a ceramic multilayer component.

SUMMARY

Embodiments of the invention specify an improved ceramic multilayer component and a method for the production thereof.

A method for producing ceramic multilayer components is specified. The method comprises providing green layers for the ceramic multilayer components. The green layers are preferably layers made of a raw material, which is not sintered, for example, for the ceramic multilayer components. The method furthermore comprises providing the green layers with inner electrodes. The inner electrodes can comprise copper (Cu).

In one embodiment, the inner electrodes are made of copper.

The green layers are preferably each coated with at least one inner electrode or inner electrode layer.

The method furthermore comprises the stacking of the green layers provided with the inner electrodes to form a stack. The stacking is preferably performed such that the inner electrodes are each arranged between two adjacent green layers.

In one preferred embodiment, the method comprises, after the stacking of the green layers, the compression of the stack to form a block. The method furthermore comprises the isolation of the block into partial blocks, wherein each partial block has a longitudinal direction. A partial block of the block can be a bar.

The longitudinal direction of the block can relate in the present application to a main extension direction of the block. Front faces of the block can extend in particular in parallel to the longitudinal direction. The longitudinal direction furthermore preferably extends perpendicularly to a depth or width of the block. The mentioned front faces preferably refer to lateral surfaces of the block, on which the inner electrodes can be contacted with outer electrodes or an outer contact.

In one preferred embodiment, the block is cut to isolate the block.

In one preferred embodiment, the block is cut only once, in particular for the isolation, transversely to the longitudinal direction and/or along the longitudinal direction of the block, preferably to form two or more partial blocks of equal length. The number of the partial blocks can be between 2 and 10.

In one preferred embodiment, the block or the already cut parts of the block is/are cut multiple or a plurality of times along a depth in parallel to the longitudinal direction.

In one preferred embodiment, the block is cut multiple times transversely to the longitudinal direction for the isolation. The number of the partial blocks can be between 2 and 10 in this case.

In one preferred embodiment, the block is cut in parallel to the longitudinal direction more often than transversely to the longitudinal direction of the block for the isolation. By way of this embodiment, the production or processing effort, in particular the thermal treatment and the mechanical machining, can advantageously be reduced, because a smaller number of parts or partial blocks have to be processed or machined, in particular on surfaces on which the partial blocks are provided with outer electrodes (see below). In other words, lateral surfaces, which extend in parallel to the longitudinal direction of the block, can advantageously be processed or machined in parallel in subsequent method steps.

A surface normal of these lateral surfaces can be oriented perpendicularly to the longitudinal direction in this case.

The method furthermore comprises, preferably after the isolation of the block into the partial blocks, the thermal treatment of the partial blocks.

In one preferred embodiment, the thermal treatment comprises decarbonization of the partial blocks. The decarbonization can furthermore comprise, for example, to expel carbon from the partial blocks, subjecting the partial blocks to a special, for example, low-oxygen atmosphere.

In one preferred embodiment, the partial blocks are sintered during the thermal treatment. The sintering is advantageously performed after the decarbonization.

The method furthermore comprises, after the thermal treatment, the mechanical machining of surfaces of the partial blocks. The mechanical machining can be a removal of material from the surfaces of the partial blocks, preferably grinding.

The method furthermore comprises, preferably after the mechanical machining, the provision of the partial blocks with outer electrodes. The partial blocks are preferably provided with the outer electrodes on lateral surfaces, which are parallel to the longitudinal direction. In particular, when providing the partial blocks with the outer electrodes, the inner electrodes are advantageously contacted, i.e., connected in an electrically conductive manner to the outer electrodes.

The method furthermore comprises the isolation of the partial blocks in each case transversely to the longitudinal direction into individual ceramic multilayer components. During the isolation of the partial blocks transversely to the longitudinal direction, in each case a partial block is preferably cut multiple times transversely to the longitudinal direction, to form individual ceramic multilayer components.

In one preferred embodiment, the partial blocks are each isolated transversely to the longitudinal direction after the mechanical machining. Thus, during the production of the ceramic multilayer components, complex and serial processing of already finished isolated components or base bodies for the components can advantageously be omitted. Multi-layered ceramic, for example, piezoelectric, multilayer components, for example, actuators, are typically processed over many process steps in already isolated form. Layer stacks, for example, consisting of ceramic films and inner electrodes, are isolated in this case, after being compressed into actuators, by separating methods. They are then decarbonized, sintered, ground, and metalized or contacted thereafter as individual components.

Such processing requires a large amount of effort, on the one hand, because each actuator is machined individually, and it is linked to technical problems, on the other hand. These include possible warping, for example, distortion, of the actuators during sintering, which can have particularly strong effects in actuators having a small cross section. The consequence can be that the ceramic multilayer components or actuators are unusable or increased grinding effort is necessary, with corresponding material loss. A further problem can relate to a grinding allowance, a grinding tolerance, or an offset of insulating regions of the respective actuator during the grinding of the lateral surfaces.

In particular, for proper contacting of the inner electrodes, a large grinding allowance can be disadvantageous, since the widths of the mentioned insulating regions are reduced by the grinding and therefore short-circuits could occur between the inner electrodes from a specific grinding allowance, in particular in operation of the ceramic multilayer components.

The machining of partial blocks or bars instead of individual actuators provides the following advantages:

the production or processing effort, in particular from the thermal treatment up to the mechanical machining, is reduced, because the number of parts is less in each processing step;

material loss, for example, due to grinding allowance, is reduced;

warping of components having a small cross section (for example, 3×3 mm) is reduced;

the cross-sectional area fulfills requirements for the surface quality, and no further machining (for example, grinding) is thus required of, for example, 2 sides of each actuator;

the symmetry of insulating regions can be increased by setting cutting positions in the completely processed bar;

the risk of mechanical damage (for example, edge chipping) of individual actuators is substantially reduced, because the bars are only isolated into actuators during a processing step which is applied late; this can advantageously result in an increase of the yield of the actuators;

in addition, the possibility exists of introducing new processes such as etching of inner electrodes in or on insulating regions of the ceramic layers or green layers for the production of actuators having improved electrical properties and/or lengthened service life with comparatively low production effort.

In one preferred embodiment, the surfaces of the partial blocks are mechanically machined on opposing outer or lateral surfaces, on which the partial blocks are provided with outer electrodes, preferably in a later method step. The outer or lateral surfaces are preferably circumferential surfaces of the block or partial block and not the surfaces of the top and bottom sides. The surfaces of the top and bottom sides can also be mechanically processed, for example, to a lesser extent than the mentioned circumferential surfaces of the block.

In one preferred embodiment, the mechanical machining of the surfaces of the partial blocks comprises four outer surfaces of each partial block.

In one preferred embodiment, the method comprises, after providing the partial blocks with outer electrodes, providing the partial blocks with an outer contact, for example, by a solder or by a soldering process. For example, the outer contact can be an electrical conductor or can comprise such an electrical conductor, which can be connected in an electrically conductive manner to the outer electrode via the solder.

In one preferred embodiment, the partial blocks are isolated, after the provision of the partial blocks with the outer electrodes and after the provision of the partial blocks with the outer contact, into individual ceramic multilayer components in each case transversely to the longitudinal direction.

In one preferred embodiment, the ceramic multilayer component is a piezoelectric multilayer component or a piezoelectric actuator.

In one embodiment, the ceramic multilayer component is a multilayer capacitor.

Furthermore, a ceramic, for example, piezoelectric multilayer component is specified, which is producible or produced by means of the method described here.

In one preferred embodiment, the proposed method comprises providing green layers for the ceramic multilayer components, providing the green layers with inner electrodes, stacking the green layers provided with the inner electrodes to form a stack and subsequently compressing the stack to form a block, isolating the block into partial blocks each having a longitudinal direction, thermally treating the partial blocks and subsequently mechanically machining surfaces of the partial blocks, providing the partial blocks with outer electrodes, and isolating the partial blocks in each case transversely to the longitudinal direction into individual ceramic multilayer components.

BRIEF DESCRIPTION OF THE DRAWINGS

Further advantages, advantageous embodiments, and advantageous features of the invention result from the following description of the exemplary embodiments in conjunction with the figures.

Identical, equivalent, and identically acting elements are provided with identical reference signs in the figures. The figures and the size relationships of the elements shown in the figures are not to scale. Rather, individual elements can be shown exaggeratedly large for better illustration ability and/or for better comprehension.

The figures indicate a production method for ceramic multilayer components.

DETAILED DESCRIPTION OF ILLUSTRATIVE EMBODIMENTS

Figure 1:
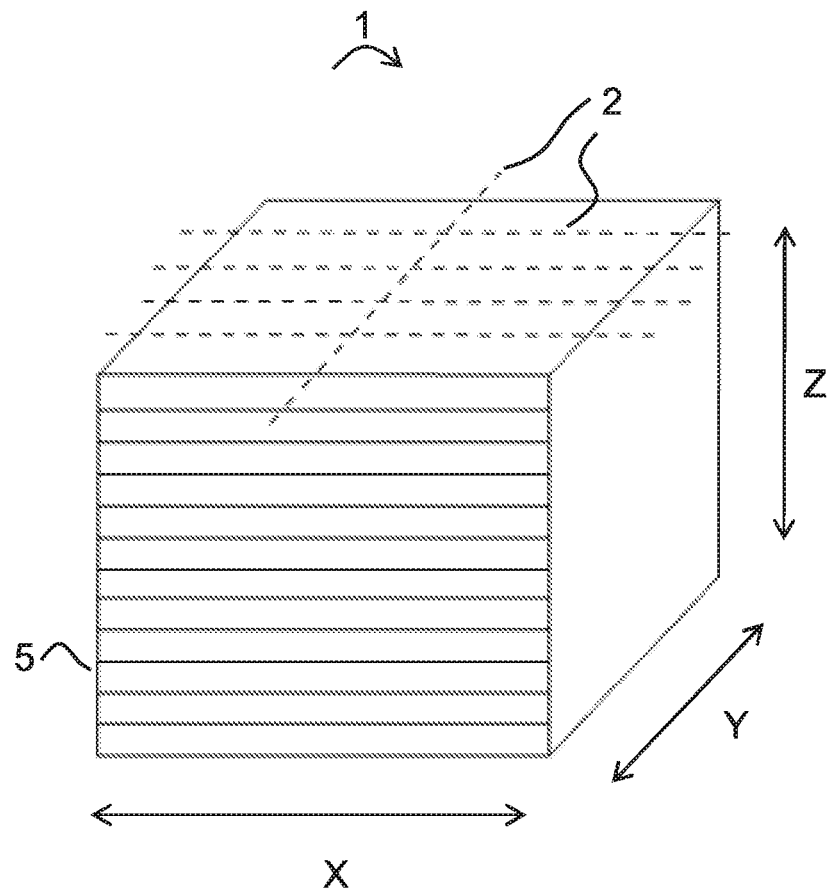
FIG. 1 schematically shows a block of green layers provided with inner electrodes.

FIG. 1 shows a block 1. The block 1 has preferably been formed or produced by compressing a stack made of green layers 5, which are layered on one another and are provided with inner electrodes (not explicitly shown). The stack direction corresponds to the direction Z in FIG. 1. For this purpose, the green layers 5 have preferably been previously provided and have preferably each been provided with at least one of the inner electrodes. The green layers 5 can be films for a ceramic or ceramic layer to be produced. The inner electrodes can be printed onto the ceramic films, for example, by screenprinting.

The block 1 has a longitudinal direction X. After the stacking of the green layers 5 provided with inner electrodes, at least one inner electrode layer is preferably located between two adjacent green layers 5.

The inner electrodes or inner electrode layers can furthermore be arranged laterally offset alternately in the stack direction, so that, for example, only every second inner electrode layer is accessible and can be contacted on one side of the stack.

Figure 2:
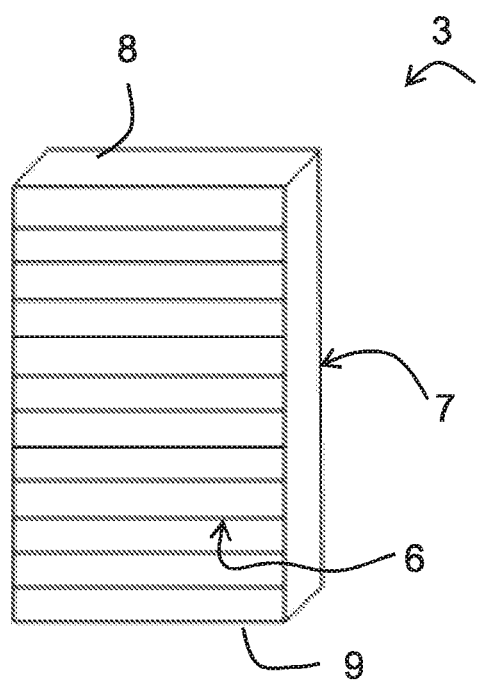
FIG. 2 schematically shows a partial block which was isolated from the block.

The block 1 is isolated into partial blocks 3 after the compression. Such a partial block 3 is shown in FIG. 2. The contours of the partial blocks 3 are indicated in FIG. 1 by cuts or cutting directions 2. The isolation is preferably cutting of the block 1 into partial blocks 3. The cuts are preferably performed during the isolation in parallel and perpendicularly to the longitudinal direction X. In particular, "perpendicularly to the longitudinal direction X" preferably means transversely to the longitudinal direction. The block 1 is preferably cut only once perpendicularly or transversely to the longitudinal direction X. Alternatively, the block 1 can be cut multiple times transversely to the longitudinal direction X. The number of the partial blocks 3 which were cut transversely to the longitudinal direction X can be between 2 and 10. In parallel to the longitudinal direction X, the block 1 is preferably cut multiple times (for example, four times in FIG. 1). The number of the partial blocks which were cut in parallel to the longitudinal direction X can be between 2 and 50, for example (cf. Y direction in FIG. 1). The block is preferably cut more often in parallel to the longitudinal direction X than transversely to the longitudinal direction X of the block 1 for the isolation, since in this way the production effort can be reduced (see above). The cut surfaces of the partial blocks preferably already fulfill the requirements for the desired surface quality in this case, for example, with reference to the roughness.

FIG. 2 shows a partial block 3 or bar as an example of a plurality of partial blocks 3 isolated from the block 1.

The proposed method furthermore comprises, after the isolation of the block 1 into the partial blocks 3, the thermal treatment of the partial blocks 3. The thermal treatment can comprise decarbonization of the partial blocks 3 to expel carbon from the partial blocks 3, for example, in a low-oxygen atmosphere. The low-oxygen atmosphere can be an atmosphere having reduced oxygen partial pressure. In particular, oxidation of the inner electrodes, which are made of copper (Cu), for example, can be prevented or restricted by a reduced oxygen partial pressure. After the decarbonization, the thermal treatment preferably comprises sintering of the green layers to form ceramic layers.

The method furthermore comprises, preferably after the thermal treatment, the mechanical machining of top surfaces or lateral surfaces of the partial blocks 3. The mechanical machining is preferably performed on the lateral surfaces 6, 7, 8, and 9 of the partial block or blocks 3.

Subsequently, each individual partial block 3 is preferably provided with outer electrodes (not explicitly shown). The outer electrodes are preferably attached or deposited on main lateral surfaces of the partial blocks 3. These main lateral surfaces are identified in FIG. 2 with the reference signs 6 and 7.

Particularly high requirements are placed with respect to the mechanical machining of the lateral surfaces 6 and 7, because of the above-mentioned problem of the grinding allowance because of possible insulating regions on the lateral surfaces 6 and 7. The insulating regions can be formed by the lateral offset of adjacent inner electrodes in the stack direction, so that, for example, during the provision of the partial blocks with outer electrodes, only every second inner electrode is contacted and/or connected in an electrically conductive manner to the respective outer electrode in each case on the lateral surfaces 6 and 7.

Figure 3:
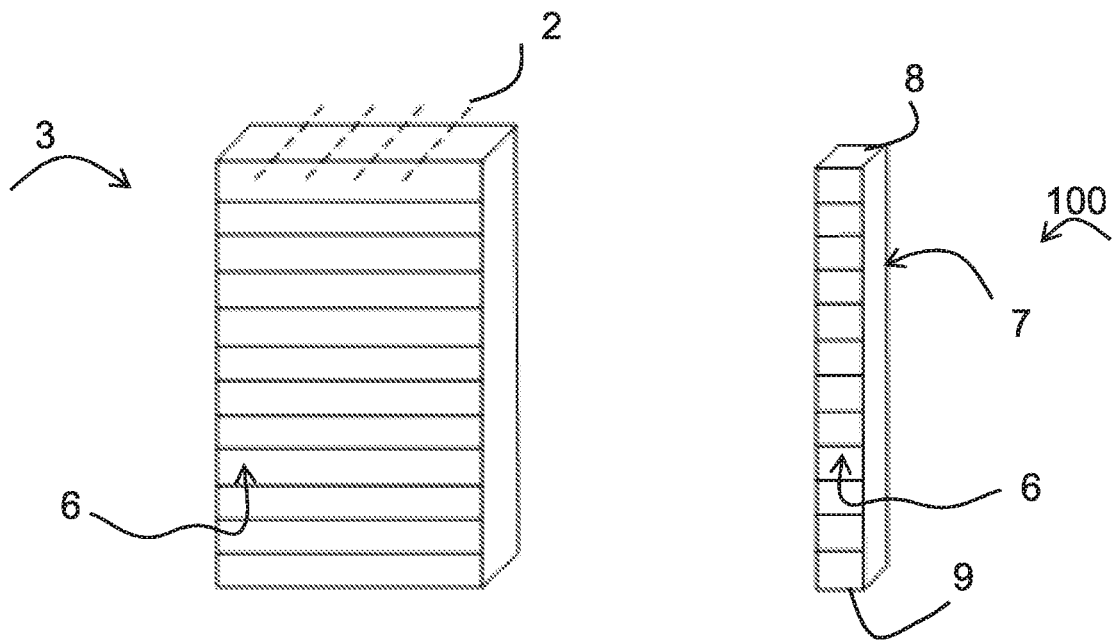
FIG. 3 indicates the isolation of a partial block.

FIG. 3 illustrates the isolation of the partial blocks transversely to the longitudinal direction X into individual ceramic multilayer components 100. In this case, each partial block 3 is isolated or cut transversely to the longitudinal direction X after the provision with the outer electrodes. A subsequent (after the isolation) thermal and/or mechanical treatment of at least the lateral surfaces 6 and 7 of the ceramic multilayer component 100 (on the right in FIG. 3) is advantageously no longer necessary due to the proposed method.

The proposed method can be applied during the production of multilayered piezoelectric actuators having copper (Cu) inner electrodes. Furthermore, components or actuators having other electrode types, for example, made of Ag or AgPd, can also be processed or produced in the same manner.

This technology can also be applied in other products, for example, in multilayered ceramic capacitors, wherein the multilayered components or multilayer components are processed over many processing steps as a part of the block or as an entire block and not in isolated form.

Multiple structural forms of multilayer components or partial blocks were produced, for example, having the dimensions $3.4 \times 3.4 \times 27$ mm$^3$ to $5.2 \times 5.2 \times 60$ mm$^3$.

Figure 4:
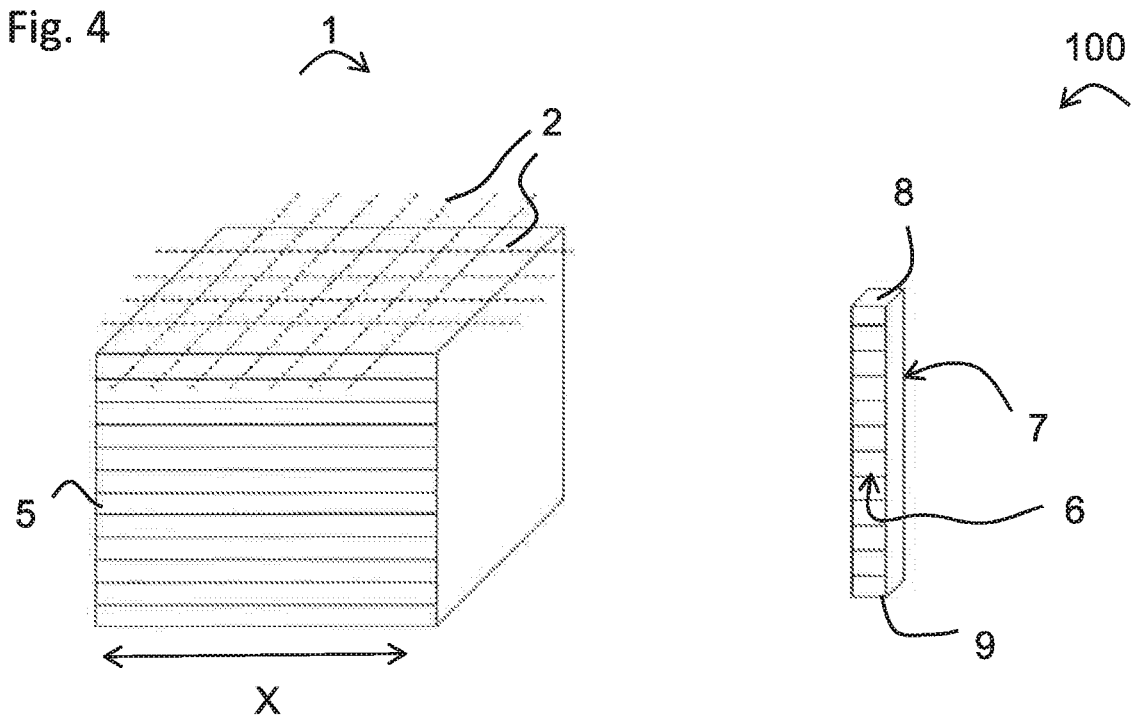
FIG. 4 indicates a production method for a ceramic multilayer component, on the basis of which the advantages of the method according to FIGS. 1 to 3 are explained.

In FIG. 4, a production method of a ceramic multilayer component is indicated, on the basis of which the advantages of the method according to FIGS. 1 to 3 are explained. A block 1 according to FIG. 1 is especially shown. The contours of the partial blocks 3, into which the block 1 is isolated (see on the right in FIG. 4) are indicated, as described above, by cuts or cutting directions 2. The right image shows a partial block 3 or bar as an example of a plurality of partial blocks 3 isolated from the block 1. The cuts 2 are produced or extend in parallel and transversely to the longitudinal direction X here for the isolation. Transversely to the longitudinal direction X, the block 1 can be cut precisely or approximately as often as in parallel to the longitudinal direction X in this method—in contrast to the above-described method. The method described in FIGS. 1 to 3 offers the advantages over the method from FIG. 4 of significantly simplified production of the ceramic multilayer component (as described above).

The invention is not restricted by the description on the basis of the exemplary embodiments. Rather, the invention comprises every novel feature and every combination of features, which includes in particular every combination of features in the patent claims, even if this feature or this combination is not itself explicitly specified in the patent claims or exemplary embodiments.

The invention claimed is:
1. A method for producing ceramic multilayer components, the method comprising:
providing green layers with inner electrode layers for the ceramic multilayer components;
stacking the green layers into a stack and subsequently compressing the stack to form a block;
separating the block into partial blocks, each of the partial blocks having a longitudinal direction;
thermally treating the partial blocks, wherein thermally treating comprises decarbonizing the partial blocks under reduced oxygen partial pressure;
mechanically machining by grinding surfaces of the partial blocks after thermally treating, wherein mechanically machining of the surfaces comprises grinding opposite lateral surfaces, a surface of a bottom side and a surface of a top side of each of the partial blocks;
providing the partial blocks with outer electrodes; and separating the partial blocks into individual ceramic multilayer components, each of the partial blocks being isolated transversely to the longitudinal direction, wherein, after separating the partial blocks into the individual ceramic multilayer components, no further machining by grinding is performed, wherein each individual ceramic multilayer component is a piezoelectric multilayer component, and wherein the inner electrode layers are copper electrode layers.

2. The method according to claim 1, wherein the outer electrodes are copper electrodes.

3. The method according to claim 1, wherein stacking the green layers comprises stacking the green layers with the inner electrode layers, some of the inner electrode layers being electrically coupled to a first electrode of the outer electrodes and others of the inner electrode layers being electrically coupled to a second electrode of the outer electrodes.

4. The method according to claim 1, wherein separating the block into the partial blocks comprises cutting the block only once transversely to the longitudinal direction of the block.

5. The method according to claim 1, wherein separating the block into the partial blocks comprises cutting the block multiple times transversely to the longitudinal direction of the block.

6. The method according to claim 1, wherein separating the block into the partial blocks comprises cutting the block more often in parallel to the longitudinal direction of the block than transversely to the longitudinal direction of the block.

7. The method according to claim 1, wherein the opposite lateral surfaces of the partial blocks are provided with the outer electrodes.

8. The method according to claim 1, wherein, after providing the partial blocks with the outer electrodes, the method further comprises providing the partial blocks with an outer contact.

9. The method according to claim 8, wherein the outer contact is provided by a solder or by a soldering process.

10. A method for producing ceramic multilayer components, the method comprising:
providing green layers with inner electrode layers for the ceramic multilayer components;
stacking the green layers into a stack and subsequently compressing the stack to form a block;
separating the block into partial blocks, each of the partial blocks having a longitudinal direction;
thermally treating the partial blocks, wherein thermally treating comprises decarbonizing the partial blocks under reduced oxygen partial pressure;
mechanically machining by grinding surfaces of the partial blocks after thermally treating, wherein mechanically machining of the surfaces comprises grinding opposite lateral surfaces, a surface of a bottom side and a surface of a top side of each of the partial blocks;
providing the partial blocks with outer electrodes; and
separating the partial blocks into individual ceramic multilayer components, each of the partial blocks being isolated transversely to the longitudinal direction,
wherein, after separating the partial blocks into the individual ceramic multilayer components, no further machining by grinding is performed,
wherein the inner electrode layers are copper electrode layers, and
wherein each individual ceramic multilayer component is a piezoelectric actuator.

11. A method for producing ceramic multilayer components, the method comprising:
providing green layers with inner electrode layers for the ceramic multilayer components;
stacking the green layers into a stack and subsequently compressing the stack to form a block;
separating the block into partial blocks, each of the partial blocks having a longitudinal direction;
thermally treating the partial blocks, wherein thermally treating comprises decarbonizing the partial blocks under reduced oxygen partial pressure;
mechanically machining by grinding surfaces of the partial blocks after thermally treating, wherein mechanically machining of the surfaces comprises grinding opposite lateral surfaces, a surface of a bottom side and a surface of a top side of each of the partial blocks;
providing the partial blocks with outer electrodes; and
separating the partial blocks into individual ceramic multilayer components, each of the partial blocks being isolated transversely to the longitudinal direction,
wherein, after separating the partial blocks into the individual ceramic multilayer components, no further machining by grinding is performed,
wherein the inner electrode layers are copper electrode layers, and
wherein each individual ceramic multilayer component is a multilayer capacitor.

12. The method according to claim 11, wherein the outer electrodes are copper electrodes.

13. The method according to claim 11, wherein stacking the green layers comprises stacking the green layers with the inner electrode layers, some of the inner electrode layers being electrically coupled to a first electrode of the outer electrodes and others of the inner electrode layers being electrically coupled to a second electrode of the outer electrodes.

14. The method according to claim 11, wherein separating the block into the partial blocks comprises cutting the block only once transversely to the longitudinal direction of the block.

15. The method according to claim 11, wherein separating the block into the partial blocks comprises cutting the block multiple times transversely to the longitudinal direction of the block.

16. The method according to claim 11, wherein separating the block into the partial blocks comprises cutting the block more often in parallel to the longitudinal direction of the block than transversely to the longitudinal direction of the block.

17. The method according to claim 11, wherein the opposite lateral surfaces of the partial blocks are provided with the outer electrodes.

18. The method according to claim 11, wherein, after providing the partial blocks with the outer electrodes, the method further comprises providing the partial blocks with an outer contact.

* * * * *